United States Patent [19]

Dankert

[11] 3,839,783

[45] Oct. 8, 1974

[54] THERMISTOR MANUFACTURING METHOD

[75] Inventor: Roger W. Dankert, Tustin, Calif.

[73] Assignee: Rodan Industries, Inc., Anaheim, Calif.

[22] Filed: July 12, 1972

[21] Appl. No.: 271,203

[52] U.S. Cl. ........................ 29/588, 29/589, 29/447, 264/272

[51] Int. Cl. ........................ B01j 17/00

[58] Field of Search .......... 29/588, 576 S, 589, 447; 117/218; 264/272

[56] References Cited

UNITED STATES PATENTS

| | | | |
|---|---|---|---|
| 3,121,279 | 2/1964 | Van Hoof et al. | 29/576 S |
| 3,494,022 | 2/1970 | Maute | 29/588 |
| 3,650,003 | 3/1972 | Toyoshima | 29/588 |
| 3,157,449 | 11/1964 | Hennessey | 29/447 |
| 3,494,023 | 2/1970 | Dorendorf | 29/588 |

*Primary Examiner*—W. Tupman
*Attorney, Agent, or Firm*—Philip M. Hinderstein

[57] ABSTRACT

A solderless method of electrically connecting a pair of insulated electrical leads to the conductive electrode material on the opposite sides of a thermistor wafer comprising the steps of exposing the ends of the leads, crossing the leads so that they contact each other, positioning the wafer between the crossed leads so that the leads contact the electrode material, the wafer being held between the leads by the spring tension thereof, coating the leads and the wafer with an electrically insulating, thermally conductive material, and permitting the coating material to cure with the leads and the wafer therein. Preferably, the coating material shrinks during the curing step so that pressure is applied on the leads to urge them against the electrode material.

7 Claims, 4 Drawing Figures

THERMISTOR MANUFACTURING METHOD

BACKGROUND OF THE INVENTION

1. Field of the Invention

The present invention relates to a thermistor manufacturing method and, more particularly, to solderless a method of electrically connecting a pair of insulated electrical leads to the conductive electrode material on the opposite sides of a wafer of thermistor material.

2. Description of the Prior Art

Thermally sensitive resistors are used in a wide variety of electrical circuits for the measurement or detection of temperature changes and for the control of circuit operation in the presence of temperature changes. Devices having electrical resistance which is intended to change with temperature variations to some significant degree are referred to as thermistors.

A typical thermistor includes a disc or wafer of ceramic thermistor material having a pair of electrical leads connected to the opposite sides thereof. There are presently two primary techniques for connecting a pair of electrical leads to the opposite sides of a wafter of thermistor material. In the first manufacturing process, the termistor wafer is formed, sintered at a high temperature, and then cooled to provide a finished thermistor wafer. A conductive electrode material is then placed on opposite sides of the wafer. Such conductive electrode material, which is often silver, may be placed on the opposite sides of the wafer by spraying, painting, silk-screening, or the like. The wafer is then fired again and it is ready to have the electrical leads connected thereto. Such connection is performed by soldering copper or any other material leads to the conductive material. Such soldering can be done in conventional ways or the leads may be crossed so that they contact each other, the wafer may be positioned between the crossed leads where it is held by the spring tension thereof, and the entire assembly may be dip soldered.

. Where such a manufacturing process is used, a highly stable resistance value is only attainable after an extended aging process. The reason for this is that the soldering process adversely affects the resistance value, for two primary reasons. In the first instance, the soldering process causes a thermal shock which only gradually decays. In addition, the silver electrode material has a tendency to migrate or leach from the ceramic wafer to the lead or tin which is present in common soldering materials. Because of the combination of these effects, an extended stabilization or aging period is required after the soldering process in order to reach a stable resistance value. Even at elevated temperatures, this aging process may require several weeks, creating handling and inventory problems and increasing the expense of the finished product.

These problems may be solved by the other primary thermistor manufacturing process in which the thermistor material, while still in a slurry state, is molded around two platinum or platinum-iridium wires which function as the electrical leads. Thereafter, the thermistor and wire combination is sintered as before. When the sintering step is completed, the wires are in place and soldering is unnecessary.

While this latter manufacturing process solves the stability problem of the former process, it is extremely expensive and therefore finds very limited use. One of the reasons for the expense is that platimum or platinum-iridium wires must be used since they are essentially the only available materials which will withsand the high sintering temperatures required for manufacturing the thermistor wafer without oxidizing to an extent which would limit electrical contact. In addition, additional handling is required because of the requirement to carefully insert the wires into the thermistor material, one at a time, while in a slurry state.

SUMMARY OF THE INVENTION

According to the present invention a thermistor manufacturing process is utilized which has the advantages of both of the manufacturing techniques described previously, but none of their disadvantages. With the present manufacturing process, a higly stable resistance value is achieved, without extended aging and without the use of expensive platinum wires or the manufacturing process which requires them.

Briefly, the present method is identical to the first manufacturing process described previously up to the point where the completed thermistor wafer having conductive electrode material on the opposite sides thereof is positioned and held between the leads of a pair of insulated electrical leads. At this point, the leads with the wafer therebetween is coated with an electrically insulating, thermally conductive material which is allowed to cure to bond the wafer and leads therein. Preferably, the coating material shrinks during the curing step to apply pressure on the leads to urge them against the electrode material.

OBJECTS

It is therefore an object of the present invention to provide a thermistor manufacturing method.

It is a further object of the present invention to provide a solderless method of electrically connecting a pair of insulated electrical leads to the conductive electrode material on the opposite sides of a wafer of thermistor material.

It is a still further object of the present invention to provide a thermistor manufacturing method which has the advantages of prior manufacturing techniques but none of their disadvantages.

It is another object of the present invention to provide a thermistor manufacturing method in which a highly stable resistance value is achieved, without extended aging, and without the use of expensive platinum wires or the manufacturing process which requires them.

Still other objects, features, and attendant advantages of the present invention will become apparent to those skilled in the art from a reading of the following detailed description of the preferred embodiment thereof, taken in conjunction with the accompanying drawings wherein like numerals designate like parts in the several figures and wherein

DESCRIPTION OF THE PREFERRED EMBODIMENT

Figure 1:
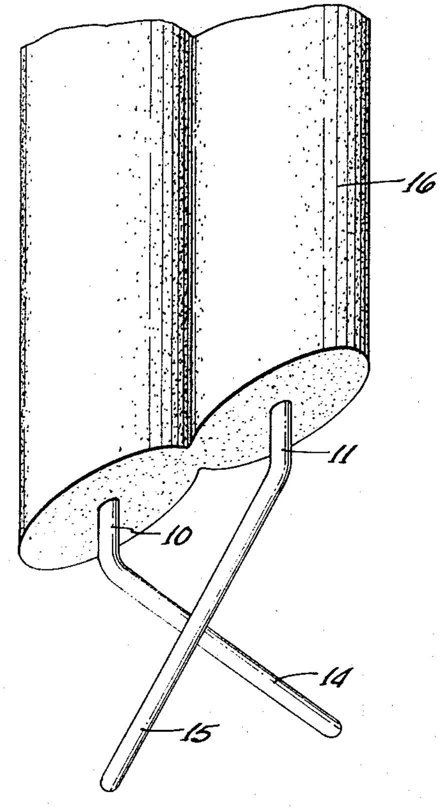
FIG. 1 is a perspective view of a pair of insulated electrical leads showing the first and second steps of the present thermistor manufacturing method.
Figure 2:
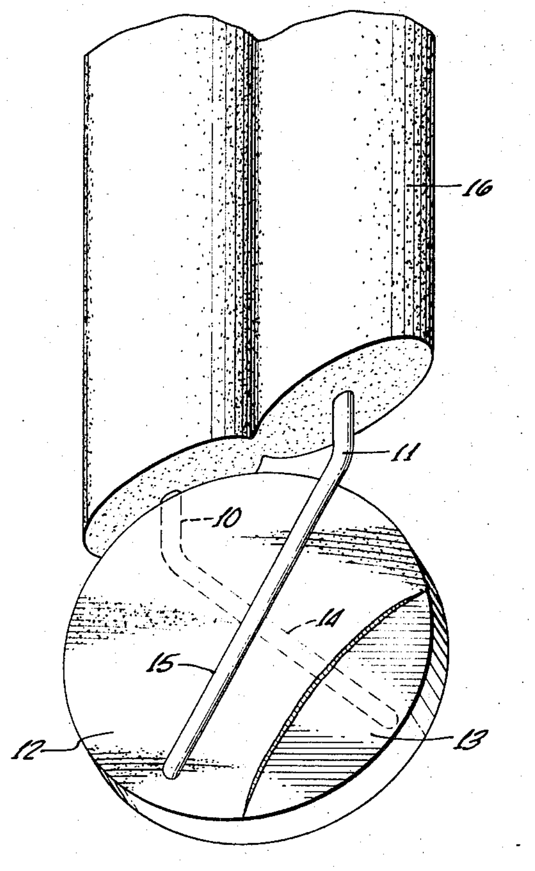
FIG. 2 is a view similar to FIG. 1 showing the third step of the present thermistor manufacturing method.

Referring now to the drawings and, more particularly, to FIGS. 1 and 2 thereof, there is shown the first three steps of a process for manufacturing a thermistor. More specifically, the present method electrically connects a pair of insulated electrical leads 10 and 11 to the conductive electrode material 12 on the opposite sides of a thermistor wafer 13. Wafer 13 is manufactured according to conventional manufacturing techniques. The wafer is formed, sintered at a high temperature, and then cooled to provide a finished thermistor wafer having a highly stable resistance value. Conductive electrode material 12 is then placed on opposite sides of wafer 13 by spraying, painting, silk-screening, or any other conventional technique. Wafer 13 is then fired again, and is ready to have electrical leads 10 and 11 connected thereto.

According to the present invention, and with reference to FIG. 1, the ends of leads 10 and 11 are exposed, at 14 and 15, respectively, by stripping away the insulation 16. Typically, the length of exposed ends 14 and 15 of leads 10 and 11, respectively, will be approximately equal to the diameter of wafer 13. Exposed ends 14 and 15 of leads 10 and 11, respectively, are then crossed, as shown in FIG. 1, so that they contact each other. Typical lead materials have a sufficient spring tension so that they will retain such a crossed position.

Referring now to FIG. 2, the completely manufactured wafer 13 with conductive electrode material 12 on the opposite sides thereof is positioned between crossed ends 14 and 15 of leads 10 and 11, respectively. Again, because of the spring tension of leads 10 and 11 and the fact that wafer 13 is extremely small and light, it is possible to support wafer 13 between ends 14 and 15 of leads 10 and 11, respectively, solely by such spring tension. For example, wafer 13 may be 0.100 inches in diameter and 0.030 inches thick.

Figures 3, 4:
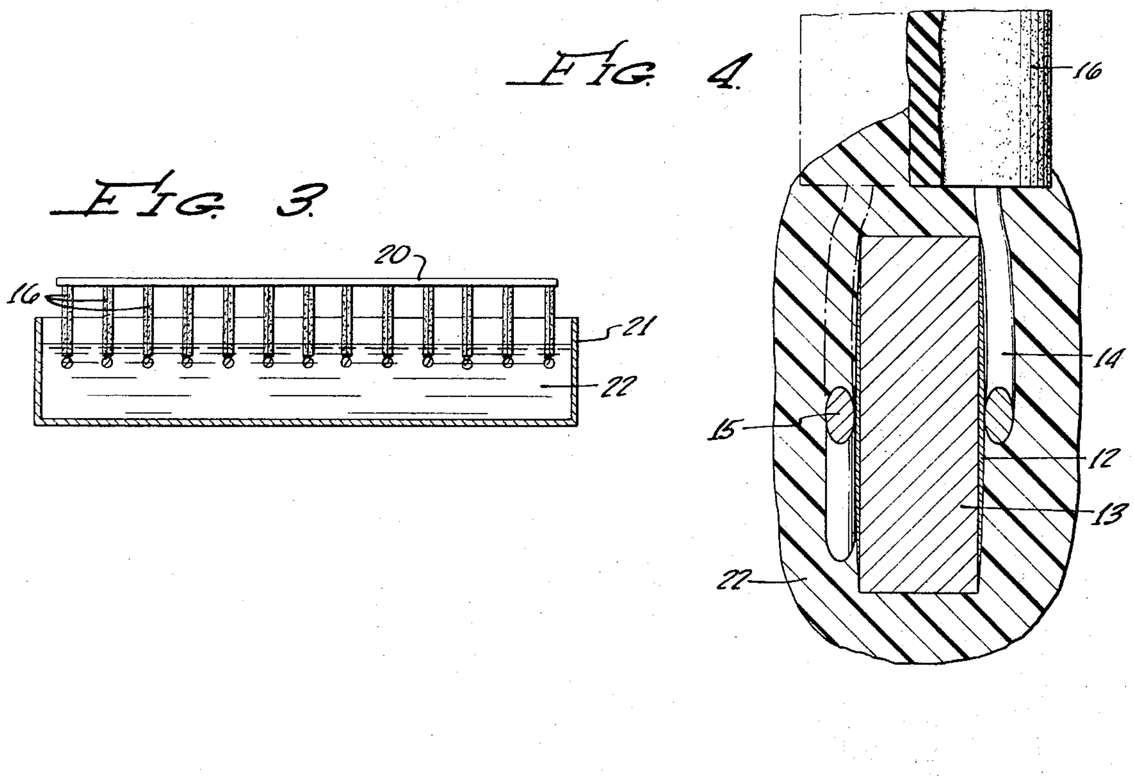
FIG. 3 is a view showing the fourth step of the present thermistor manufacturing method.
FIG. 4 is a sectional view taken through the center of the pair of leads of FIGS. 1 and 2 showing a completed thermistor, manufactured according to the method of FIGS. 1-3.

In a typical manufacturing facility, a plurality of pairs of leads would be supported in parallel, spaced relationship by a suitable bracket 20. Bracket 20 would support leads 10, 11 with exposed ends 14 and 15 all at approximately the same height. Thereafter, it is the teaching of the present invention that such leads, with thermistors 13 positioned as shown in FIG. 2, are dipped into a suitable container 21 having an electrically insulating, thermally conductive material 22 therein in a liquid state. Material 22 completely coats wafer 13, exposed ends 14 and 15 of leads 10 and 11, respectively, and a small portion of the end of insulation 16. Thereafter, bracket 20 is elevated to remove ends 14 and 15 and wafers 13 from coating material 22 and the coating material is permitted to cure with leads 14 and 15 and wafer 13 there in. After curing, the finished configuration has the general appearance shown in FIG. 4 where wafer 13 with ends 14 and 15 of leads 10 and 11, respectively, in contact with electrode material 12 on opposite sides thereof, is completely encapsulated within a bead of coating material 22.

In other words, coating material 22 performs the function of holding ends 14 and 15 of electrical leads 10 and 11, respectively, in contact with the opposite sides of thermistor 13, providing all of the force necessary to electrically connect leads 10 and 11 to wafer 13. According to the preferred embodiment of the present invention, coating material 22 is of a type which shrinks during the curing thereof so that an additional amount of pressure is applied on ends 14 and 15 of leads 10 and 11, respectively, to urge them against electrode material 12. An aluminum oxide-loaded epoxy material has been found higly suitable since aluminum oxide is both electrically insulating and thermally conductive. In addition, such epoxy material may be acquired with any desired shrinkage factor, as discussed previously.

It can therefore be seen that in accordance with the present invention, a thermistor manufacturing method is utilized which has the advantages of both the manufacturing techniques commonly used, but none of their disadvantages. The present manufacturing method is identical to the most commonly used manufacturing process up to the point where the completed thermistor wafer 13 having conductive material 12 on the opposite sides thereof is positioned and held between the exposed ends 14 and 15 of a pair of insulated electrical leads 10 and 11, respectively. However, the heretofore used soldering step which adversely affects the long term stability of the resistance value and which requires an extended stabilization period to remove is completely eliminated by coating thermistor wafer 13 and exposed ends 14 and 15 of leads 10 and 11, respectively, with an electrically insulating, thermally conductive material 22 which is allowed to cure to bond the wafer and leads therein. As a result, the highly stable resistance value which exists prior to the normal soldering step is preserved and extended aging and the need for platinum wires is eliminated.

While the invention has been described with respect to a preferred embodiment thereof, it will be apparent to those skilled in the art that various modifications and improvements may be made without departing from the scope and spirit of the invention, Accordingly, it is to be understood that the invention is not to be limited by the specific illustrative embodiment, but only by the scope the appended claims.

I claim:

1. A solderless method of electrically connecting a pair of insulated electrical leads to the conductive electrode material on the opposite sides of a thermistor wafer consisting only of the steps of:

exposing the ends of said leads;

crossing said leads so that they contact each other;

positioning said wafer between said crossed leads so that said leads contact said electrode material, said wafer being held between said leads by the spring tension thereof;

coating said exposed ends of said leads and said wafer with an electrically insulating, thermally conductive materia; and curing said coating material thereby electrically connecting said leads to said electrode material.

2. A method according to claim 1 wherein said coating mataerial shrinks during said curing step to apply pressure on said leads to urge them against said electrode material.

3. A method according to claim 2 wherein said coating material is an aluminum oxide-loaded epoxy.

4. A method according to claim 1 wherein said step of coating said exposed ends of said leads and said wafer consists of:

dipping said exposed ends and said wafer into said coating material while in a liquid state.

5. In a process for manufacturing a thermistor probe wherein the exposed ends of a pair of insulated electrical leads are electrically connected to the conductive electrode material on the opposite sides of a wafer of ceramic thermistor material, said wafer being positioned between said leads so that said leads contact said electrode material, said wafer being held between said leads by the spring tension thereof, the improvement wherein said leads are retained in contact with said electrode material only by:

coating said exposed ends of said leads with said wafer therebetween with an electrically insulating, thermally conductive material; and permitting said coating material to cure with said leads and said wafer therein whereby said coating material holds said ends of said leads in contact with said opposite sides of said wafer thereby electrically connecting said leads to said electrode material without the use of solder.

6. In a manufacturing process according to claim 5, the improvement wherein said coating material shrinks during said curing step to apply pressure on said leads to urge them against said electrode material.

7. A method according to claim 5 wherein said step of coating said exposed ends of said leads and said wafer consists of:

dipping said exposed ends and said wafer into said coating material while in a liquid state.

* * * * *